(12) United States Patent
Kim et al.

(10) Patent No.: US 7,547,462 B2
(45) Date of Patent: Jun. 16, 2009

(54) METHOD OF FABRICATING ORGANIC LIGHT EMITTING DISPLAY DEVICE

(75) Inventors: Mu-Hyun Kim, Suwon-si (KR);
Byung-Doo Chin, Suwon-si (KR);
Seong-Taek Lee, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 811 days.

(21) Appl. No.: 11/013,944

(22) Filed: Dec. 17, 2004

(65) Prior Publication Data
US 2005/0186330 A1    Aug. 25, 2005

(30) Foreign Application Priority Data
Feb. 19, 2004    (KR) ............... 10-2004-0011145

(51) Int. Cl.
*B05D 5/06*    (2006.01)
(52) U.S. Cl. .................. 427/66; 427/258; 313/504; 428/917; 445/24
(58) Field of Classification Search ............ 427/66, 427/258; 445/24; 428/917; 313/504–506
See application file for complete search history.

(56) References Cited
U.S. PATENT DOCUMENTS
6,194,119 B1    2/2001    Wolk (Continued)

FOREIGN PATENT DOCUMENTS
JP    07-094278    *    4/1995

(Continued)

OTHER PUBLICATIONS

*Office action* from the Chinese Patent Office issued in Applicant's corresponding Chinese Patent Application No. 200410010489.7 dated Nov. 30, 2007.

(Continued)

*Primary Examiner*—Timothy H Meeks
*Assistant Examiner*—Jimmy Lin
(74) *Attorney, Agent, or Firm*—Robert E. Bushnell, Esq.

(57) ABSTRACT

The present invention relates to a flat panel display, and more particularly, to a method of fabricating an organic light emitting display device so as to improve device characteristics by patterning a plurality of organic layers using a heat transfer method to optimize thicknesses according to R, G and B pixels. The method includes: forming lower electrodes of R, G and B pixels on an insulating substrate; forming an organic layer on the insulating substrate; and forming an upper electrode on the organic layer. Formation of the organic layer includes forming a hole injection layer and a hole transport layer of the R, G and B pixels on the entire surface of the substrate as a common layer. The R and G emission layers are patterned by a heat transfer method using a heat transfer device having a transfer layer such that an organic layer is patterned to a thickness obtained by subtracting a thickness of the B emission layer from the thicknesses of the R and G emission layers required in R and G colors.

10 Claims, 5 Drawing Sheets

U.S. PATENT DOCUMENTS

| | | | |
|---|---|---|---|
| 2001/0001050 A1* | 5/2001 | Miyashita et al. | 428/690 |
| 2003/0044639 A1 | 3/2003 | Fukuda | |
| 2003/0224202 A1* | 12/2003 | Brown et al. | 428/690 |
| 2004/0104394 A1* | 6/2004 | Lin et al. | 257/79 |

FOREIGN PATENT DOCUMENTS

| | | |
|---|---|---|
| JP | 08-064862 | 3/1996 |
| JP | 10-055888 | 2/1998 |
| JP | 2000-012216 | 1/2000 |
| JP | 2000-323277 | 11/2000 |
| WO | WO 00/18193 | 3/2000 |

OTHER PUBLICATIONS

*Office action* from the Japanese Patent Office issued in Applicant's corresponding Japanese Patent Application No. 2004-363540 dated Dec. 21, 2007.

Office action from the Japanese Patent Office issued in Applicant's corresponding Japanese Patent Application No. 2004-363540 dated Apr. 24, 2009.

* cited by examiner

METHOD OF FABRICATING ORGANIC LIGHT EMITTING DISPLAY DEVICE

CLAIM OF PRIORITY

This application makes reference to, incorporates the same herein, and clams all benefits accruing under U.S.C. §119 from an application for ORGANIC LIGHT EMITTING DISPLAY DEVICE AND METHOD OF FABRICATING THE SAME earlier filed in the Korean Intellectual Property Office on 19 Feb. 2004 and there duly assigned Serial No. 2004-11145.

BACKGROUND OF THE INVENTION

1. Field of the Invention

The present invention relates to a flat panel display and, more particularly, to a method of fabricating an organic light emitting display device capable of improving device characteristics by patterning a plurality of organic layers using a heat transfer method to optimize the thickness on the basis of each of R, G and B pixels.

2. Description of the Related Art

Generally, an organic light emitting display device (OLED) includes lower and upper electrodes formed on an insulating substrate, and a plurality of organic layers formed between the upper and lower electrodes. The organic layers are selected from a hole injection layer, a hole transport layer, an emission layer, a hole blocking layer, an electron transport layer and an electron injection layer according to functions of the respective layers. This display device has such a structure that the upper and lower electrodes are formed of transparent or non-transparent electrodes to emit light from the organic layer toward the insulating layer or in the reverse direction of the insulating layer, or toward the insulating layer and in the reverse direction of the insulating layer.

The full color OLED of the prior art has problems in that the optical thicknesses of the respective R, G and B pixels are different so that color coordinates and efficiency characteristics deteriorate.

SUMMARY OF THE INVENTION

The present invention solves the aforementioned problems by providing a method of fabricating an organic light emitting display device (OLED) using a heat transfer method capable of simplifying processes and improving device characteristics.

In an exemplary embodiment of the present invention, a method of fabricating an organic light emitting display device includes: forming lower electrodes of R, G and B pixels on a substrate; forming an organic layer on the substrate; and forming an upper electrode on the organic layer. Formation of the organic layer includes forming a hole injection layer and a hole transport layer of the R, G and B pixels on an entire surface of the substrate as a common layer, and patterning the R and G emission layers by a heat transfer method using a heat transfer device having a transfer layer such that an organic layer is patterned to a thickness obtained by subtracting a thickness of a B emission layer from thicknesses of the R and G emission layers required in R and G colors.

The organic layer is formed of a thin film, the R and G emission layers have thickness of about 300~400 Å, the B emission layer has a thickness of about 100~200 Å, the patterned R and G emission layers have thicknesses of about 100~300 Å and 50~250 Å, respectively, and each thickness has a tolerance of about 50~200 Å.

In another exemplary embodiment of the present invention, a method of fabricating an organic light emitting display device includes: forming lower electrodes of R, G and B pixels on a substrate; forming an organic layer on the substrate; and forming an upper electrode on the organic layer. Formation of the organic layer includes forming a hole injection layer of the R, G and B pixels on an entire surface of the substrate, patterning a hole transport layer of the R and G pixels, patterning emission layers of the R and G pixels, and forming an emission layer of the B pixel on an entire surface of the substrate. The hole transport layers and the emission layers of the R, G and B pixels are simultaneously formed by a heat transfer method using a heat transfer device having an organic layer as a transfer layer, at which the hole transport layer and the emission layer are respectively patterned. Thicknesses of the hole transport layers of the R and G pixels are equal to the difference between a sum of the thicknesses of the hole injection layer and the hole transport layer of the R and G pixels and the value of the thickness of the hole injection layer of the B pixel.

The R, G and B emission layers, the hole injection layer and the hole transport layer are formed of thick organic films, and the B pixel has the hole transport layer having the smallest thickness of the R, G and B pixels. The hole injection layer of the B pixel has a thickness of about 1350 Å, and the hole transport layers of the R and G pixels have thicknesses of about 1350 Å and 350 Å, respectively.

In addition, the R and G emission layers are patterned to a thickness obtained by subtracting a thickness of the B emission layer from the thicknesses of the R and G emission layers. The R and G emission layers have thicknesses of about 300~400 Å, the B emission layer has a thickness of about 100~200 Å, the patterned R and G emission layers have thicknesses of about 100~300 Å and 50~250 Å, respectively, and each thickness has a tolerance of about 50~200 Å.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
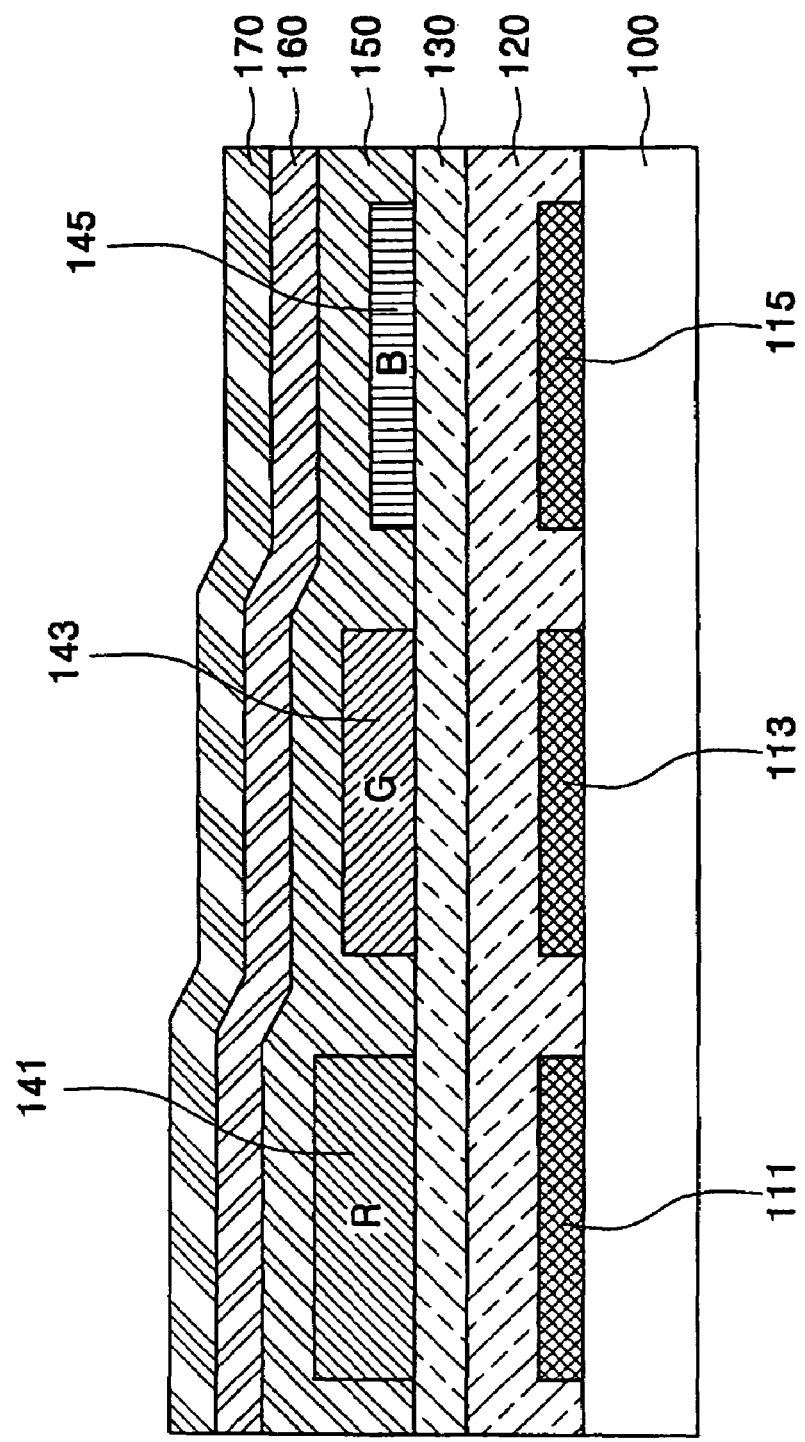
FIG. 1 is a cross-sectional view of an OLED.

Reference will now be made in detail to the embodiments of the present invention, examples of which are illustrated in the accompanying drawings, wherein like reference numerals refer to the like elements throughout. The embodiments are described below in order to explain the present invention by referring to the figures, in which the length, the thickness, etc., of a layer and a region may be exaggerated for clarity.

FIG. 1 is a cross-sectional view illustrating the structure of a full color OLED.

Referring to FIG. 1, anode electrodes 111, 113 and 115 are patterned and formed on an insulating substrate 100 as lower electrodes according to the respective pixels, and then a hole injection layer 120 and a hole transport layer 130 are sequentially formed on the entire surface of the insulating substrate 100. R, G and B organic emission layers 141, 143 and 145 are formed in correspondence to the anode electrodes, 111, 113 and 115, respectively, of the pixels, and a hole blocking layer 150 and an electron transport layer 160 are sequentially formed over the entire surface of the insulating substrate 100. A cathode electrode 170 is formed on the electron transport layer 160 as an upper electrode.

The emission layers (EML) 141, 143 and 145 of the R, G and B pixels are formed above the anode electrodes 111, 113 and 115 of the R, G and B pixels to an appropriate thickness according to R, G and B colors. In addition, a charge transport layer, such as the hole injection layer (HIL) 120 and the hole transport layer (HTL) 130, and the hole blocking layer (HBL) 150 and the electron transport layer (ETL) 160 are formed on the entire surface of the substrate 100 as a common layer.

In the latter arrangement, the charge transport layer, such as the hole injection layer 120 and the hole transport layer 130, is formed on the entire surface of the substrate 100. That is, each of the R, G and B emission layers is formed using a shadow mask, and then the charge transport layer, such as the hole injection layer 120 and the hole transport layer 130, is formed on the entire surface of the substrate 100.

Figure 2:
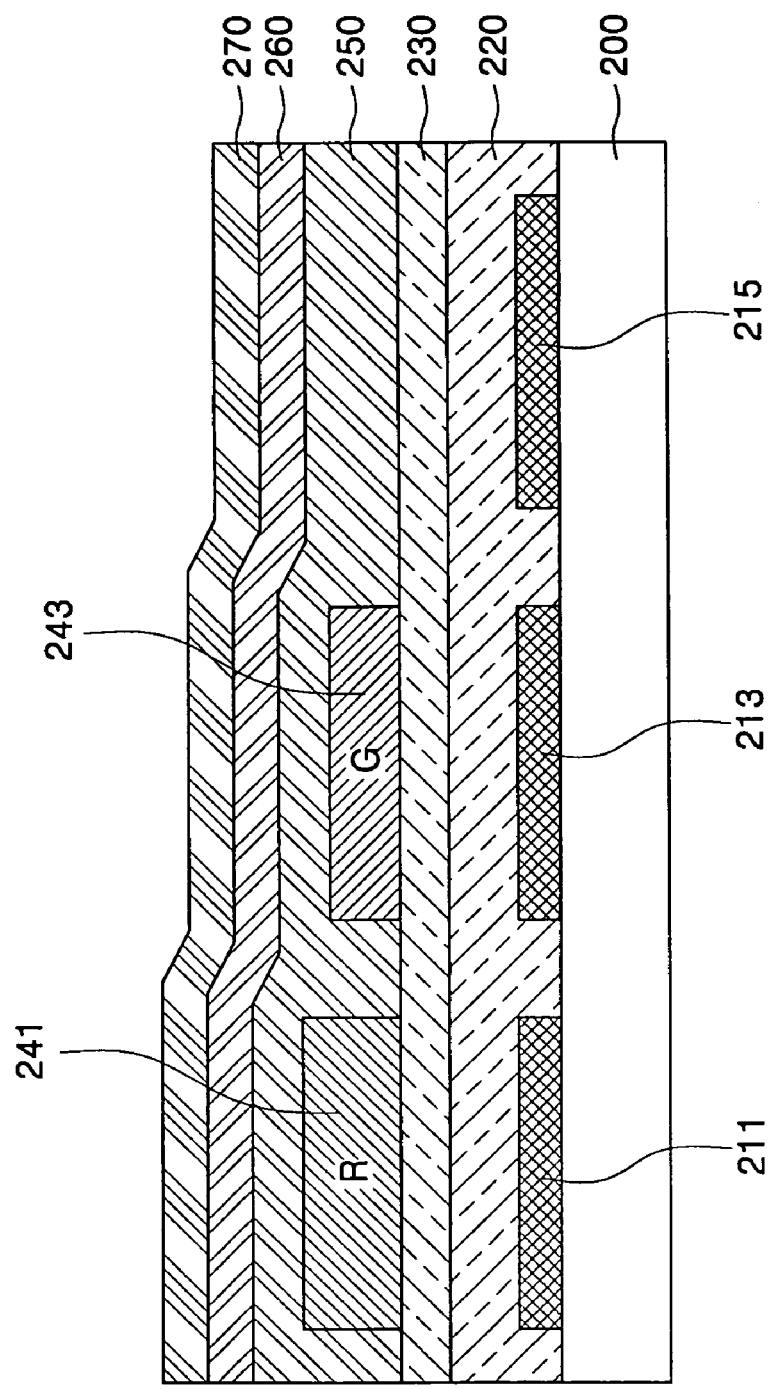
FIG. 2 is a cross-sectional view of an OLED in accordance with a first embodiment of the present invention.

FIG. 2 is a cross-sectional view of an OLED in accordance with a first embodiment of the present invention. This embodiment employs a thin organic layer.

Referring to FIG. 2, anode electrodes 211, 213 and 215 of R, G and B pixels are formed so as to be isolated from each other on a substrate 200 as lower electrodes. An organic layer (described below) is formed on the substrate 200, and a cathode electrode 270 is formed on the organic layer as an upper electrode. The upper electrode 270 comprises a transparent electrode or a semi-transparent electrode, and light emitted from the organic layer is emitted in a reverse direction relative to the substrate 200. The organic layer includes emission layers 241 and 243 of the R and G pixels patterned in correspondence to the anode electrodes 211 and 213, respectively, of the R and G pixels, an emission layer 250 of the B pixel formed as a common layer, and a charge transport layer (described below) formed on and under the emission layers 241, 243 and 250.

The charge transport layer includes a hole injection layer 220 and a hole transport layer 230 formed between the anode electrodes 211, 213 and 215 of the R, G and B pixels and the emission layers 241, 243 and 250 of the R, G and B pixels. In addition, the charge transport layer includes an electron transport layer 260 formed between the R, G and B emission layers 241, 243 and 250 and the cathode electrode 270. The R and G emission layers 241 and 243 are made of phosphorescent material, and the B emission layer 250 is made of fluorescent material so as to act as a hole blocking layer.

In accordance with a first embodiment of the present invention, a method of forming an organic layer using a heat transfer method will be described in conjunction with FIG. 2 and Tables 1 and 2 as follows.

TABLE 1

| | Sum of thicknesses of HIL and HTL | Thickness of EML | Sum of thicknesses of HBL and ETL |
|---|---|---|---|
| R | 350 Å | 300~400 Å | 300 Å |
| G | 350 Å | 250~350 Å | 300 Å |
| B | 350 Å | 100~200 Å | 300 Å |

TABLE 2

| | Sum of thicknesses of HIL and HTL | Thickness of EML | Thickness of B common layer | Sum of thicknesses of HBL and ETL |
|---|---|---|---|---|
| R | 350 Å | 100~300 Å | 100~200 Å | 300 Å |
| G | 350 Å | 50~250 Å | 100~200 Å | 300 Å |
| B | 350 Å | 100~200 Å | | 300 Å |

Tables 1 and 2 represent thicknesses optically optimized according to R, G and B pixels, when indium tin oxide (ITO) having a thickness of 125 Å is used as an upper electrode and the organic layer is formed of a thin film. In the latter regard, the thicknesses of the respective layers have a tolerance of about 50~200 Å. Table 1 represents optically optimized thicknesses of the respective layers when each of the R, G and B emission layers is patterned and then formed, and Table 2 represents optically optimized thicknesses of the respective layers, as described in the first embodiment, when the R and G emission layers 241 and 243 are patterned and the B emission layer 250 is formed as a common layer so as to act as a hole blocking layer.

In accordance with the first embodiment of the present invention, the anode electrodes 211, 213 and 215 of the R, G and B pixels are formed so as to be isolated from each other on the substrate 200, and the hole injection layer 220 and the hole transport layer 230 are deposited on the entire surface of the substrate as a charge transport layer. The R and G emission layers 241 and 243 are then formed on the hole transport layer 230 in correspondence to the anode electrodes 211 and 213 of the R and G pixels. That is, the R emission layer 241 is patterned so as to correspond to the anode electrode 211 of the R pixel through a heat transfer method using a heat transfer device (not shown) having only an organic layer for the R emission layer as a transfer layer. Then, the G emission layer 243 is patterned so as to correspond to the anode electrode 213 of the G pixel through a heat transfer method using a heat transfer device (not shown) having only an organic layer for the G emission layer as a transfer layer.

Subsequently, the B emission layer 250 is formed on the entire surface of the substrate 200 as a common layer so as to act as the B emission layer of the B pixel and a hole blocking layer. The electron transport layer 260 is formed on the entire surface of the B emission layer 250 as a common layer, and the cathode electrode 270 is formed on the electron transport layer 260 as the upper electrode.

When the R and G emission layers 241 and 243 are formed, as shown in Table 1, it is preferable that the layers be formed to an optically optimized thickness. Therefore, since the B emission layer 250 is formed over the entire surface of the substrate 200 as a common layer in the first embodiment, when the R and G emission layers 241 and 243 are patterned by the heat transfer method, the R and G emission layers 241 and 243 are patterned to have a thickness such that the thickness of the commonly used B emission layer 250 is subtracted from the thicknesses of the R and G emission layers 241 and 243 described in Table 1.

That is, the sum of the thicknesses of the R and G emission layers 241 and 243 patterned in the first embodiment and the thickness of the B emission layer formed as a common layer is equal to the thicknesses of the R and G emission layers in Table 1 required in the R and G colors. Specifically, referring to Tables 1 and 2, the B emission layer 250 is formed so as to have a thickness of about 100~200 Å required in the B color, and the R and G emission layers 241 and 243 are patterned by the heat transfer method so that the R and G emission layers 241 and 243 have thicknesses of about 100~300 Å and 50~250 Å, respectively, which are the thicknesses obtained by subtracting the thickness of the B emission layer 250 from the thicknesses required in the R and G emission layers 241 and 243.

Figure 3:
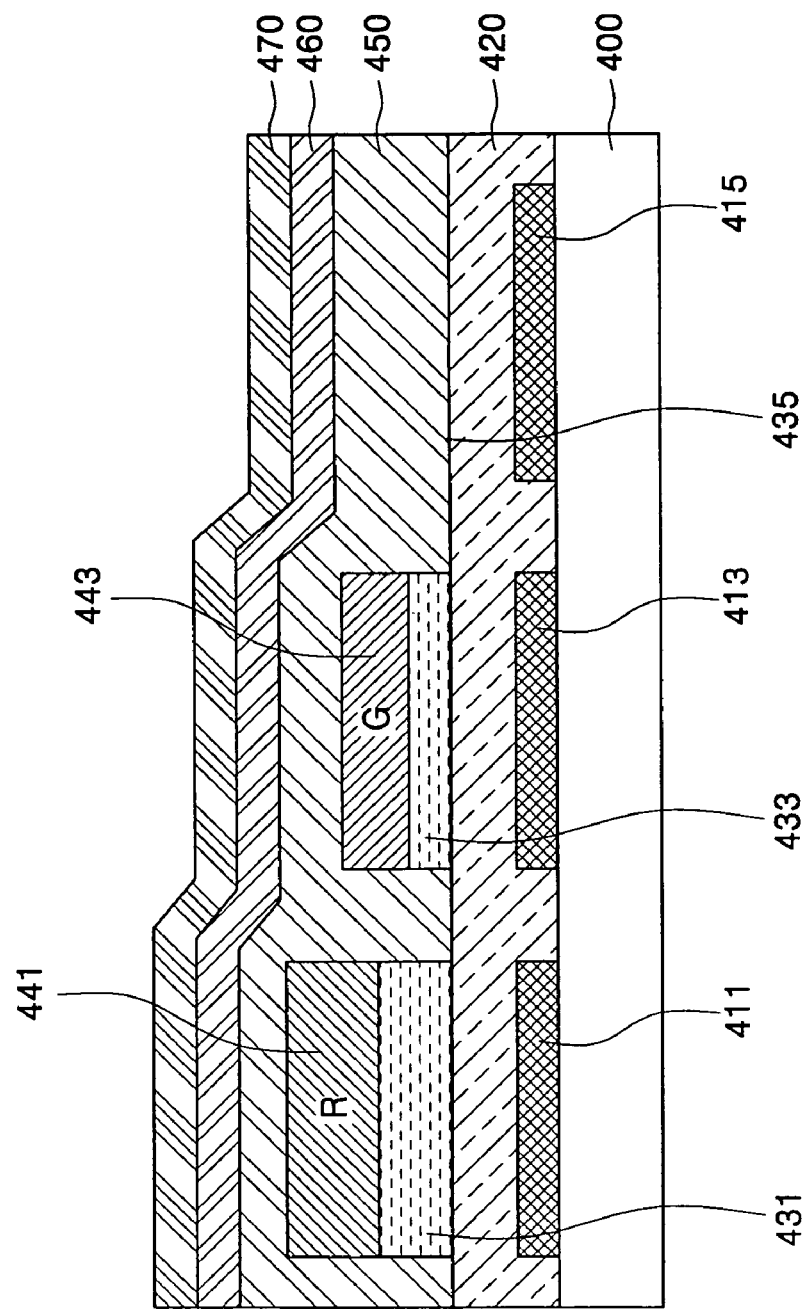
FIG. 3 is a cross-sectional view of an OLED in accordance with a second embodiment of the present invention.

FIG. 3 is a cross-sectional view of an OLED in accordance with second embodiment of the present invention. This embodiment employs a thick organic layer.

Referring to FIG. 3, anode electrodes 411, 413 and 415 of R, G and B pixels are formed so as to be isolated from each other on a substrate 400 as lower electrodes, an organic layer (described below) is formed on the substrate 400, and a cathode electrode 470 is formed on the organic layer as an upper electrode. The cathode electrode 470 comprises a transparent electrode or a semi-transparent electrode, and light emitted from the organic layer is emitted in the reverse direction relative to the substrate 400. The organic layer includes R and G emission layers 441 and 443 patterned in correspondence to the anode electrodes 411 and 413 of the R and G pixels, a B emission layer 450 of the B pixel formed as a common layer, and a charge transport layer (described below) formed on and under the emission layers 441, 443 and 450.

The charge transport layer includes a hole injection layer 420 and hole transport layers 431 and 433 of the R and G pixels formed between the anode electrodes 411, 413 and 415 of the R, G and B pixels and the emission layers 441, 443 and 450 of the R, G and B pixels. The hole transport layer 435 of the B pixel is not formed, and thus has a thickness of zero, as indicated in Table 4. The hole injection layer 420 is formed on the entire surface of the substrate 400, and the hole transport layers 431 and 433 having different thicknesses relative to each other according to the pixels are patterned in correspondence to the R and G anode electrodes 411 and 413. In addition, the charge transport layer further includes an electron transport layer 460 formed between the R, G and B emission layers 441, 443 and 450 and the cathode electrode 470. The R and G emission layers 441 and 443 are made of phosphorescent material, and the B emission layer 450 is made of fluorescent material so as to act as a hole blocking layer.

A method of fabricating an organic layer in accordance with the second embodiment of the present invention will be described in conjunction with Tables 3 and 4, and FIGS. 4A and 4B.

TABLE 3

|   | Sum of thicknesses of HIL and HTL | Thickness of EML | Sum of thicknesses of HBL and ETL |
|---|---|---|---|
| R | 2350 Å | 300~400 Å | 350 Å |
| G | 1700 Å | 250~350 Å | 350 Å |
| B | 1350 Å | 100~200 Å | 350 Å |

TABLE 4

|   | Thickness of HIL | Thickness of HTL | Thickness of EML | Thickness of B common layer | Sum of thicknesses of HBL and ETL |
|---|---|---|---|---|---|
| R | 1350 Å | 1000 Å | 100~300 Å | 100~200 Å | 350 Å |
| G | 1350 Å | 350 Å | 50~250 Å | 100~200 Å | 350 Å |
| B | 1350 Å | 0 |  | 100~200 Å | 350 Å |

Tables 3 and 4 represent thicknesses optically optimized according to the R, G and B pixels when ITO having a thickness of 125 Å is used as an upper electrode and the organic layer is formed of a thick film. In the latter regard, the thicknesses of the respective layers have a tolerance of about 50~200 Å. Table 3 represents optically optimized thicknesses of the respective layers when the hole transport layer and the hole injection layer are formed as a common layer, and Table 4 represents optically optimized thicknesses of the respective layers when the hole transport layer is formed by patterning simultaneously with the emission layer using the heat transfer method.

The anode electrodes 411, 413 and 415 of the R, G and B pixels are formed so as to be isolated from each other on the insulating substrate 400, and the hole injection layer 420 is formed on the entire surface of the substrate 400 as a charge transport layer. In that regard, the hole injection layer 420 is formed to have thicknesses of a hole transport layer and a hole injection layer of a pixel having the minimum value among the sums of the thicknesses of the hole transport layer and the hole injection layer of the R, G and B pixels. That is, as shown in Table 3, since the thicknesses of the hole transport layer and the hole injection layer of the B pixel are the smallest, the hole injection layer 420, formed as a common layer, has a thickness of about 1350 Å, which is equal to the sum of the thicknesses of the hole transport layer and the hole injection layer of the B pixel.

Figure 4A:
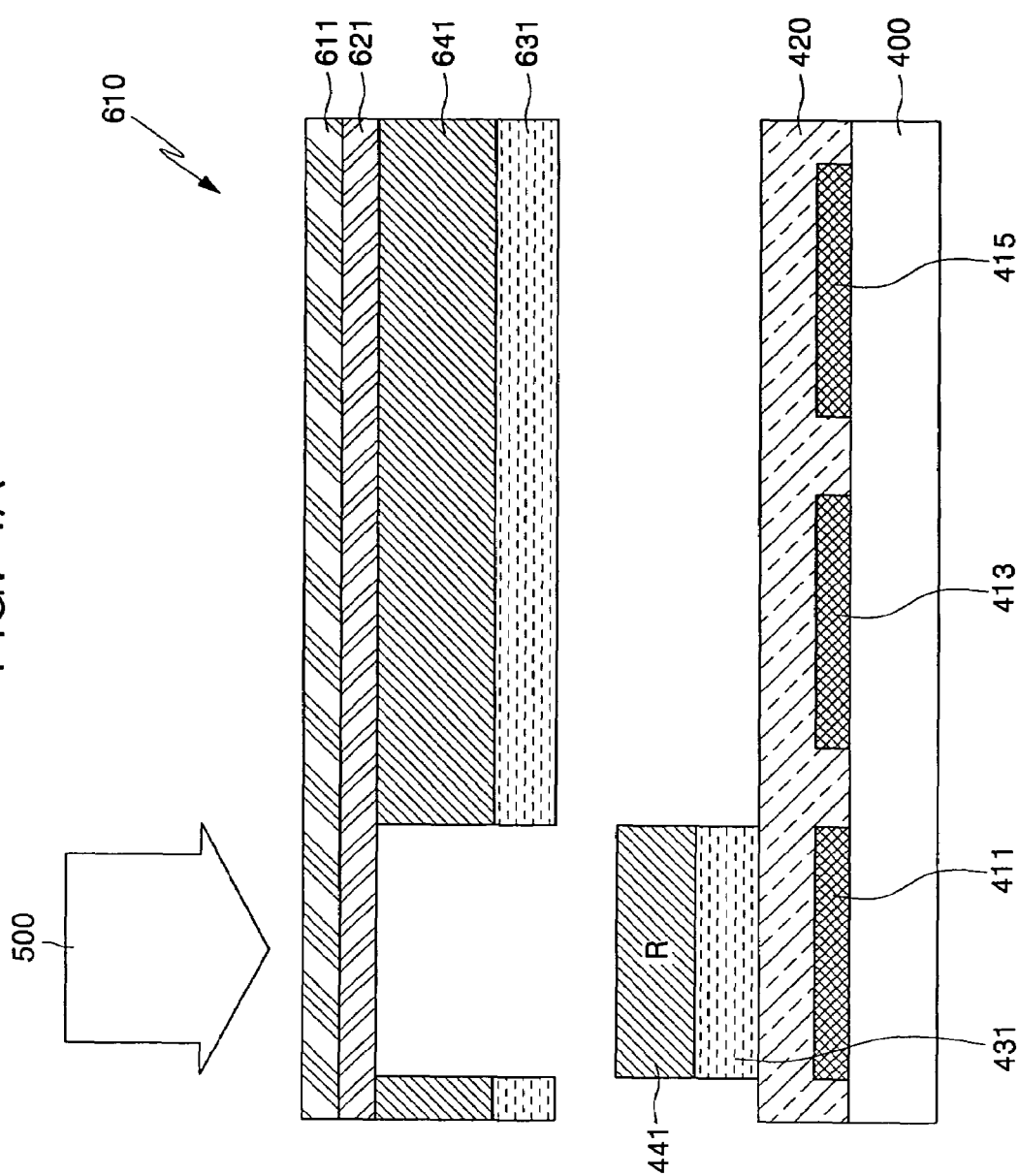
FIGS. 4A and 4B are views illustrating a method of fabricating an OLED using a heat transfer method in accordance with the second embodiment of the present invention.

Subsequently, as shown in FIG. 4A, a heat transfer device 610 for patterning an R hole transport layer 431 and an R emission layer 441 is prepared. The heat transfer device 610 includes a light conversion layer 621, an organic layer 631 for the R hole transport layer 431, and an organic layer 641 for the R emission layer 441 as a transfer layer, disposed on a base substrate 611. A laser 500 is irradiated onto the heat transfer device 610 to form the R hole transport layer 431 and the R emission layer 441 on the hole injection layer 420 above the R anode electrode 411 by simultaneously patterning the layers 431 and 441.

Figure 4B:
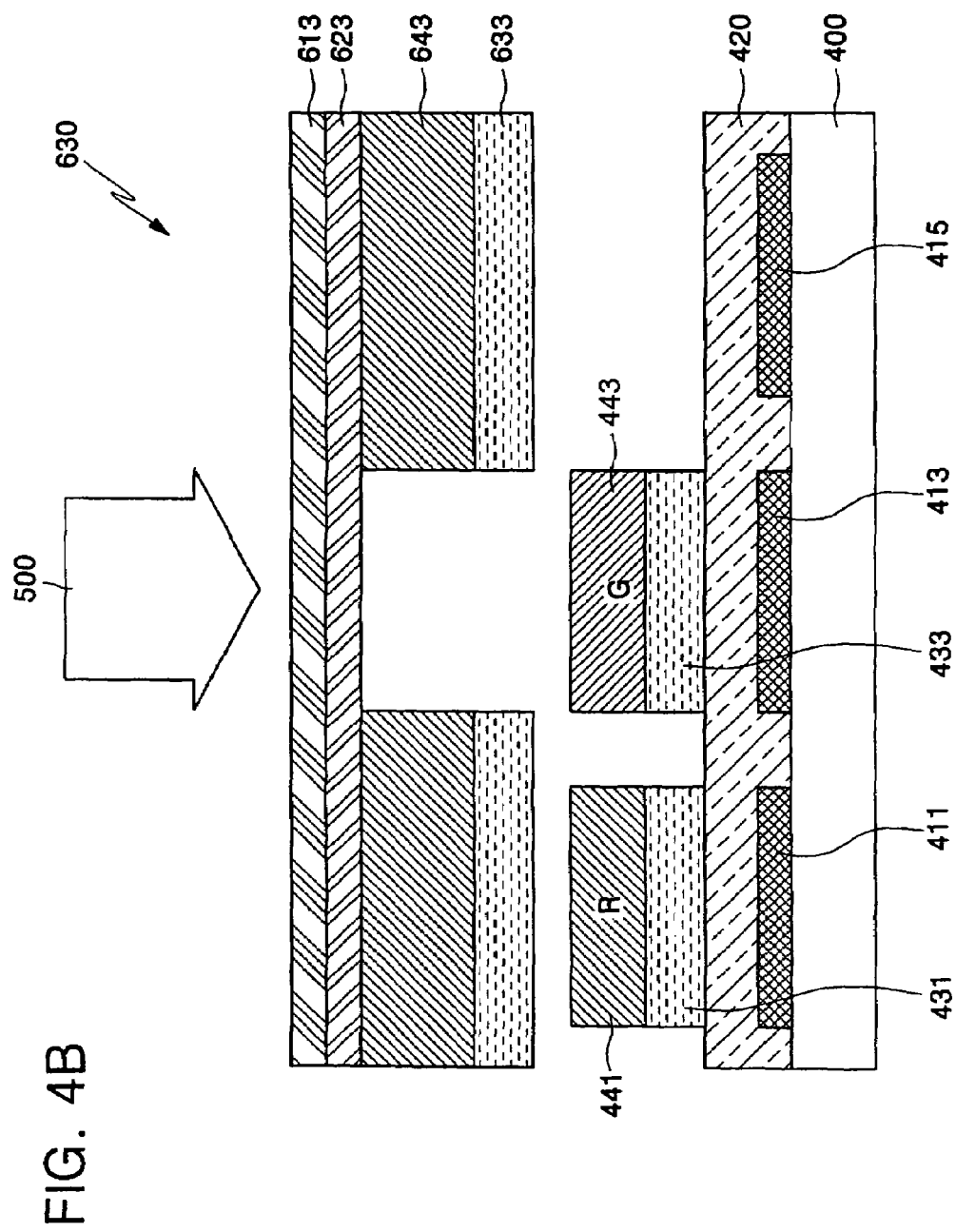

Next, as shown in FIG. 4B, a heat transfer device 630 for patterning a G hole transport layer 433 and a G emission layer 443 is prepared. The heat transfer device 630 includes a light conversion layer 623, an organic layer 633 for the G hole transport layer 433, and an organic layer 643 for the G emission layer 443 as a transfer layer, disposed on a base substrate 613. A laser 500 is irradiated onto the heat transfer device 630 to form the G hole transport layer 433 and the G emission layer 443 on the hole injection layer 420 above the G anode electrode 413 by simultaneously patterning the layers 433 and 443.

Finally, the B emission layer 450 (FIG. 3) is formed on the entire surface of the hole injection layer 420 to cover upper surfaces of the R and G emission layers 441 and 443. At this point, referring to Tables 3 and 4, since the sums of the thicknesses of the hole injection layer and the hole transport layer of the R, G and B pixels are different from one another, the thicknesses of the patterned hole transport layers 431 and 433 of the R and G pixels are different from each other.

That is, since the hole transport layer is formed in correspondence to the R and G anode electrodes 411 and 413 according to the R and G pixels, the hole injection layer 420 is formed to have a thickness of the hole transport layer of the B pixel having the smallest thickness of the R, G and B pixels. Therefore, as shown in Table 4, the hole transport layer 431 of the R pixel is formed to have a thickness of about 1000 Å, i.e., a value formed by subtracting the sum of the thicknesses of the hole injection layer and the hole transport layer of the B pixel from the sum of the thicknesses of the hole injection layer and the hole transport layer of the R pixel as shown in Table 3. In addition, the hole transport layer 433 of the G pixel is formed to have a thickness of about 350 Å, i.e., a value formed by subtracting the sum of the thicknesses of the hole injection layer and the hole transport layer of the B pixel from the sum of the thicknesses of the hole transport layer and the hole injection layer of the G pixel.

In addition, in a manner similar to the first embodiment, when the R and G emission layers 441 and 443 are formed in the second embodiment, it is preferable that the layers be formed with optically optimized thicknesses as shown in Table 3. Therefore, since the B emission layer 450 is formed on the entire surface as a common layer in the second embodiment, when the R and G emission layers 441 and 443 are patterned by a heat transfer method, the R and G emission layers 441 and 443 are simultaneously formed by patterning the R and G hole transport layers 431 and 433 so that they have thicknesses formed by subtracting the thickness of the B emission layer 450 used as a common layer from the thicknesses of the R and G emission layers 441 and 443 as described in Table 3.

Thus, the sum of the thicknesses of the R and G emission layers 441 and 443 patterned in the second embodiment and the thickness of the B emission layer 450 formed as a common layer becomes the thicknesses of the R and G emission layers in Table 3 as required in the R and G colors, respectively. That is, referring to Tables 3 and 4, the B emission layer 450 is formed to have a thickness of about 100~200 Å, required in the B color, and the R and G emission layers 441 and 443 are patterned by a heat transfer method so that they have thicknesses of about 100~300 Å and 50~250 Å, subtracting the thickness of the B emission layer 450 from the thicknesses required in the R and G emission layers 441 and 443, respectively.

When the emission layers and the hole injection layer are simultaneously patterned using a laser heat transfer method as described above, processes are simplified, and device characteristics are also improved by optimally forming the thicknesses of the organic layers according to the R, G and B pixels.

While the embodiments of the present invention illustrate the heat transfer device having a structure such that the light conversion layer and the transfer layer are deposited on the base substrate, a layer for improving heat transfer characteristics, (i.e., an intermediate layer) may be inserted. In addition, the thicknesses of the respective layers described in Tables 1 to 4 may be varied according to changes in process conditions and device characteristics.

As can be seen from the foregoing, the present invention is capable of simplifying the processes and improving yield and characteristics by forming the B emission layer as a common layer to act as a hole blocking layer. In addition, the number of processes is reduced so as to save manufacturing cost, and precision of the pattern is improved.

Further, the present invention uses a laser heat transfer method to simultaneously form emission layers and charge transport layer having optically optimized thicknesses, thereby improving color coordinates and efficiency characteristics, and improving display quality, thus rendering the invention applicable to high resolution OLEDs.

Although the present invention has been described with reference to certain exemplary embodiments thereof, it will be understood by those skilled in the art that a variety of modifications and variations may be made to the present invention without departing from the spirit or scope of the present invention as defined in the appended claims, and their equivalents.

What is claimed is:

1. A method of fabricating an organic light emitting display device, comprising the steps of:
    forming lower electrodes of R, G and B pixels on a substrate;
    forming an organic layer on the substrate; and
    forming an upper electrode on the organic layer;
    wherein the step of forming the organic layer comprises:
    forming hole injection layers and hole transport layers of the R, G and B pixels on an entire surface of the substrate as a common layer;
    forming R and G emission layers on the hole transport layers of the R and C pixels, respectively; and
    forming a B emission layer as a common layer on an entire surface of the substrate which includes the R and G emission layers;
    wherein the R and G emission layers are formed by patterning through a heat transfer method using a heat transfer device having a transfer layer so that the R and G emission layers are patterned to a thickness obtained by subtracting the thickness of the B emission common layer from optically optimized thicknesses of an R emission layer and a G emission layer required in R and G colors in a case where the B emission layer is patterned and not common.

2. The method according to claim 1, wherein the organic layer is formed of a thin film, the R and G emission layers required in R and G colors have thicknesses in a range of 300~400 Å and 250~350 Å, respectively, the B emission layer has a thickness in a range of 100~200 Å, and the patterned R and G emission layers have thicknesses in a range of 100~300 Å and 50~250 Å, respectively.

3. The method according to claim 1, wherein the R and G emission layers are made of phosphorescent material and the B emission layer is made of fluorescent material.

4. The method according to claim 1, wherein the B emission layer is made of fluorescent material so as to act as a hole blocking layer.

5. A method of fabricating an organic light emitting display device, comprising the steps of:
    forming lower electrodes of R, G and B pixels on a substrate;
    forming an organic layer on the substrate; and
    forming an upper electrode on the organic layer;
    wherein the step of forming the organic layer comprises forming hole injection layers of the R, G and B pixels on an entire surface of the substrate, patterning hole transport layers of the R and G pixels, patterning emission layers of the R and G pixels, and forming an emission layer of the B pixel as a common layer over the entire surface of the substrate which includes the emission layers of the R and G pixels; an
    wherein the hole transport layers and the emission layers of the R and G pixels are simultaneously formed by a heat transfer method using a heat transfer device having an organic layer as a transfer layer in which the hole transport layers and the emission layers are respectively patterned, and wherein thicknesses of the hole transport layers of the R and G pixels respectively are equal to a difference between a sum of optically optimized thicknesses of the hole injection layer and the hole transport layers of the R and G pixels respectively when the hole transport layer and the hole injection layer are formed as a common layer and a thickness of the hole injection layer of the B pixel.

6. The method according to claim 5, wherein the emission layers of the R, G and B pixels, the hole injection layers of the R and G pixels, and the hole transport layers of the R and G pixels are formed of thick organic films, the B pixel has a hole transport layer with a zero thickness, the hole injection layer has a thickness of about 1350 Å, and the hole transport layers of the R and G pixels have thicknesses of about 1000 Å and 350 Å, respectively.

7. The method according to claim 5, wherein the R and G emission layers are patterned to a thickness obtained by subtracting the thickness of the emission layer of the B pixel from thicknesses of emission layers of R and G pixels required in the R and G colors in a case where the hole transport layer and the hole injection layer are formed as a common layer.

8. The method according to claim 7, wherein the emission layers of the R and G pixels required in the R and G colors have thicknesses in a range of 300~400 Å and 250~350 Å, respectively, the emission layer of the B pixel has a thickness in a range of 100~200 Å, and the patterned emission layers of the R and G pixels have thicknesses in a range of 100~300 Å and 50~250 Å, respectively.

9. The method according to claim 5, wherein the emission layers of the R and G pixels are made of phosphorescent material and the emission layer of the B pixel is made of fluorescent material.

10. The method according to claim 5, wherein the emission layer of the B pixel is made of fluorescent material so as to act as a hole blocking layer.

* * * * *